United States Patent
Park

(10) Patent No.: US 7,176,763 B2
(45) Date of Patent: Feb. 13, 2007

(54) PHASE-LOCKED LOOP INTEGRATED CIRCUITS HAVING FAST PHASE LOCKING CHARACTERISTICS

(75) Inventor: Kwang-il Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 14 days.

(21) Appl. No.: 11/068,127

(22) Filed: Feb. 28, 2005

(65) Prior Publication Data

US 2005/0237120 A1   Oct. 27, 2005

(30) Foreign Application Priority Data

Apr. 26, 2004   (KR) ...................... 10-2004-0028629

(51) Int. Cl.
*H03L 7/00* (2006.01)
(52) U.S. Cl. ...................... 331/17; 331/16; 331/DIG. 2
(58) Field of Classification Search ................ 331/1 A, 331/16, 17, 10, 11, 34, DIG. 2; 327/156, 327/157
See application file for complete search history.

(56) References Cited

U.S. PATENT DOCUMENTS

| | | | |
|---|---|---|---|
| 4,322,643 A | | 3/1982 | Preslar |
| 4,757,279 A | * | 7/1988 | Balzano .......................... 331/4 |
| 5,424,689 A | * | 6/1995 | Gillig et al. ................... 331/17 |
| 5,485,125 A | | 1/1996 | Dufour |
| 5,631,587 A | * | 5/1997 | Co et al. ..................... 327/107 |
| 5,821,817 A | | 10/1998 | McCorkle |
| 5,828,255 A | | 10/1998 | Kelkar et al. |
| 5,977,801 A | | 11/1999 | Boerstler |
| 6,094,078 A | | 7/2000 | Suzuki |
| 6,124,741 A | | 9/2000 | Arcus |
| 6,147,561 A | | 11/2000 | Rhee et al. |
| 6,192,094 B1 | | 2/2001 | Herrmann et al. |
| 6,226,339 B1 | | 5/2001 | Nam et al. |
| 6,288,583 B1 | * | 9/2001 | Ozawa et al. ................ 327/113 |

(Continued)

FOREIGN PATENT DOCUMENTS

JP   5152948   6/1993

(Continued)

OTHER PUBLICATIONS

X. Zhang, "Analysis and Verification on Side Effect of Anti-Backlash Delay in Phase-Frequency Detector," Microwave Theory and Techniques Society (MTT-S) Digest, IEEE International Microwave Symposium, Jun. 8-13, 2003, pp. 17-20.

(Continued)

*Primary Examiner*—Linh V. Nguyen
(74) *Attorney, Agent, or Firm*—Myers Bigel Sibley & Sajovec PA

(57) ABSTRACT

A phase-locked loop (PLL) integrated circuit includes a voltage-controlled oscillator and a loop filter having first and second input terminals and an output terminal coupled to an input of the voltage-controlled oscillator. A charge pump and a phase-lock accelerator are provided. The charge pump is configured to drive the first input terminal of the loop filter with a pump output signal and the phase-lock accelerator is configured to drive the second input terminal of the loop filter with an analog output signal. The phase-lock accelerator is responsive to a reference clock signal and a feedback clock signal.

11 Claims, 10 Drawing Sheets

U.S. PATENT DOCUMENTS

| | | |
|---|---|---|
| 6,346,861 B2 | 2/2002 | Kim et al. |
| 6,356,158 B1 | 3/2002 | Lesea |
| 6,362,670 B1 | 3/2002 | Beaulieu |
| 6,366,144 B2 | 4/2002 | Han |
| 6,373,913 B1 | 4/2002 | Lee |
| 6,424,193 B1 | 7/2002 | Hwang |
| 6,430,244 B1 | 8/2002 | Ryu |
| 6,434,206 B1 | 8/2002 | Yu |
| 6,476,681 B1 * | 11/2002 | Kirkpatrick .................. 331/17 |
| 6,496,554 B1 | 12/2002 | Ahn |
| 6,542,040 B1 | 4/2003 | Lesea |
| 6,542,041 B2 | 4/2003 | Choi |
| 6,545,547 B2 | 4/2003 | Fridi et al. |
| 6,549,765 B2 | 4/2003 | Welland et al. |
| 6,556,088 B1 | 4/2003 | Dietl et al. |
| 6,566,920 B1 | 5/2003 | Kim |
| 6,583,657 B1 | 6/2003 | Eckhardt et al. |
| 6,587,005 B2 | 7/2003 | Ichihara |
| 6,594,330 B1 | 7/2003 | Wilson |
| 6,667,663 B2 * | 12/2003 | Ozawa ........................ 331/17 |
| 6,693,494 B2 * | 2/2004 | Fan .............................. 331/17 |
| 6,972,633 B2 * | 12/2005 | Vilhonen et al. ............. 331/17 |
| 2002/0154722 A1 | 10/2002 | Djahanshahi et al. |
| 2004/0008087 A1 * | 1/2004 | Hsu ............................. 331/17 |
| 2004/0061559 A1 * | 4/2004 | Charlon ....................... 331/17 |

FOREIGN PATENT DOCUMENTS

| | | |
|---|---|---|
| JP | 8051360 | 2/1996 |
| KR | 1020020061352 A | 7/2002 |

OTHER PUBLICATIONS

Rabaey, Digital Integrated Circuits, A Design Perspective, Prentice-Hall, Inc., 1996, pp. 540-543, no month.

* cited by examiner

PHASE-LOCKED LOOP INTEGRATED CIRCUITS HAVING FAST PHASE LOCKING CHARACTERISTICS

REFERENCE TO PRIORITY APPLICATION

This application claims priority to Korean Application Serial No. 2004-28629, filed Apr. 26, 2004, the disclosure of which is hereby incorporated herein by reference.

FIELD OF THE INVENTION

The present invention relates to integrated circuit devices and, more particularly, to integrated circuit devices that utilize phase detectors when generating periodic signals.

BACKGROUND OF THE INVENTION

Phase-locked loop (PLL) integrated circuits are frequently used to generate highly accurate internal clock signals on an integrated circuit substrate. As illustrated by FIG. 1, a conventional PLL integrated circuit 10 may include a phase detector 12, a charge pump 14, a loop filter 16, a voltage controlled oscillator (VCO) 18, a clock decoder and buffer 20, and a frequency divider 22. The phase detector 12 may be configured to generate UP and DOWN control signals in response to a reference clock signal (CKREF) and a feedback clock signal (CKVCO). In particular, the phase detector 12 may be configured to compare the phases of the clock signals and generate an active UP signal or an active DOWN signal when the feedback clock signal CKVCO lags or leads the reference clock signal CKREF. As will be understood by those skilled in the art, the reference clock signal (CKREF) may be a buffered version of an external clock signal (not shown) that is received by an integrated circuit chip. The charge pump 14 may be operative to convert the digitally encoded UP and DOWN control signals into an analog output (POUT) that sources current to or sinks current from the loop filter 16. The loop filter 16 is illustrated as generating a control voltage (Vcontrol), which is provided as an input to the VCO 18. The VCO 18 may generate a plurality of outputs, which are provided to the clock decoder and buffer 20. One of the outputs of the clock decoder and buffer 20 (shown as clock signal $\phi 1$) may be provided as an input to the frequency divider 22, which generates the feedback clock signal CKVCO. An active UP signal operates to increase the value of Vcontrol, which speeds up the VCO 18 and causes the feedback clock signal CKVCO to catch up with the reference clock signal CKREF. On the other hand, an active DOWN signal slows down the VCO 18 and eliminates the phase lead of the feedback clock signal CKVCO. These and other aspects of the PLL 10 of FIG. 1 are more fully illustrated and described at section 9.5.2 of a textbook by Jan M. Rabaey, entitled Digital Integrated Circuits: A Design Perspective, Prentice-Hall, ISBN 0-13-178609-1, pp. 540-542.

FIG. 2 illustrates a conventional charge pump 14 having both pull-up and pull-down sections. The pull-up section includes an NMOS pull-down transistor N1 in series with a resistor R1. A pull-up current mirror is provided by PMOS transistors P1 and P2. The NMOS pull-down transistor N1 is responsive to the UP control signal. When the UP control signal is active at a logic 1 level, the NMOS pull-down transistor N1 turns on and pulls-down the drain and gate of PMOS transistor P1. The feedback signal line NMOS_ON is also switched high-to-low. This causes both PMOS transistors P1 and P2 to turn on and provide a sourcing current ($I_{source}$) to the output terminal (POUT) of the charge pump 14. The pull-down section includes a PMOS pull-up transistor P3 in series with a resistor R2. A pull-down current mirror is provided by NMOS transistors N2 and N3. The gate of the PMOS pull-up transistor P3 is connected to an output of an inverter I1, which receives the DOWN control signal. When the DOWN control signal is active at a logic 1 level, the PMOS pull-up transistor P3 turns on and pulls-up the drain and gate of NMOS transistor N2. The feedback signal line PMOS_ON is also switched low-to-high. This causes both NMOS transistors N2 and N3 to turn on and withdraw a sinking current ($I_{sink}$) from the output terminal POUT. When the control signals UP and DOWN are both active at logic 1 levels, the pull-up and pull-down sections are simultaneously active. The pull-up and pull-down sections of the charge pump may be balanced so that $I_{source}$ equals $I_{sink}$ and no net current is provided to or withdrawn from the output terminal POUT. A similar charge pump is illustrated at FIG. 4 of commonly assigned U.S. Pat. No. 6,430,244 to Rhu, entitled "Digital Phase-Locked Loop Apparatus With Enhanced Phase Error Compensating Circuit," the disclosure of which is hereby incorporated by reference.

FIG. 3 illustrates a conventional phase detector 12 that utilizes a delay device D1 to provide a dead zone compensation time interval during which both the UP and DOWN control signals are temporarily active. Maintaining the UP and DOWN control signals at active levels during an overlapping time interval prevents a "dead zone" from occurring when the phases of the reference clock signal CKREF and the feedback clock signal CKVCO are so closely aligned that the generation of any active UP control signal would otherwise be immediately canceled by the generation of any active DOWN control signal and vice versa. As described in U.S. Pat. Nos. 4,322,643 to Prescar and 6,192,094 to Herrmann et al., and in an article by X. Zhang entitled "Analysis and Verification on Side Effect of Anti-Backlash Delay in Phase-Frequency Detector," Microwave Theory and Techniques Society (MTT-S) Digest, IEEE International Microwave Symposium, pp. 17–20, Jun. 8–13 (2003), the delay device D1 may also be referred to as an "anti-backlash" delay unit. The phase detector 12 is illustrated as including a pair of D-type flip-flops (DFF1 and DFF2), a NAND gate ND1, an inverter 12 and a delay device D1. The D-type flip-flops are synchronized with the reference and feedback clock signals CKREF and CKVCO. A rising edge of the reference clock signal CKREF will cause the true output Q1 of DFF1 to switch high and a rising edge of the feedback clock signal CKVCO will cause the true output Q2 of DFF2 to switch high. To prevent dead zone operation, the UP and DOWN control signals remain active whenever a rising edge of the reference clock signal CKREF is registered (by DFF1) while the DOWN control signal is active or whenever a rising edge of the feedback clock signal CKVCO is registered (by DFF2) while the UP control signal is active. Setting the UP and DOWN control signals to logic 1 levels causes the output of the NAND gate ND1 to switch high-to-low and the output of the inverter 12 to switch low-to-high. This low-to-high switching at the output of inverter 12 is delayed by a fixed time amount equal to $T_1$, by the delay device D1. The delay $T_1$ may be about 5 nanoseconds in some cases. The reset signal RST at the output of the delay device D1 will switch low-to-high some time after the output of the inverter 12 switches low-to-high in response to simultaneously active UP and DOWN control signals. When active, the reset signal RST operates to reset the flip-flops DFF1 and DFF2 (Q1=Q2=0). Upon reset, the UP and DOWN control signals will switch to inactive levels and the output POUT of the charge pump 14 of FIG. 2 will be disposed in a high impedance state.

As illustrated by FIG. 4, another conventional PLL integrated circuit 10' includes a phase detector 12', a charge pump 14', a loop filter 16', a voltage controlled oscillator (VCO) 18' and a second frequency divider 22', which is configured to divide a frequency of an output clock signal CLKOUT by N, where N is a positive integer. These elements of FIG. 4 are similar to the corresponding elements shown in FIGS. 1–3. Moreover, the loop filter 16' is illustrated as including a parallel combination of an RC network (resistor R and capacitor C2) and a capacitor C1. The reference clock signal (CKREF) is also shown as being generated by a first frequency divider 11, which is configured to divide a frequency of an applied input clock signal CLKIN by M, where M is a positive integer. Unfortunately, because the phase lock time of the PLL integrated circuit 10' of FIG. 4 is influenced by the amount of capacitance in the loop filter 16', a relatively large capacitance in the loop filter 16' may prevent the PLL from being used in high frequency memory devices operating at dual and higher data rates. To address this lock time deficiency, delay-locked loops (DLLs) have frequently been used as substitutes for PLLs in high frequency applications. Alternatively, a modified PLL, such as the PLL 50 of FIG. 5, may be used having a faster phase lock time. This PLL 50 is similar to the PLL 10' of FIG. 4, however, a register 17 and a digital-to-analog converter (DAC) 19 are provided. The register 17 stores a digital signal ds received from an external source and the DAC 19 coverts the stored digital signal ds into an analog signal that is applied internally to the loop filter 16'. This application of the analog signal operates to reduce the lock-time of the PLL 50, but requires an accurate generation of the digital signal ds, which can be complicated by process and temperature variations associated with the operation of a memory device containing the PLL 50.

SUMMARY OF THE INVENTION

Embodiments of the present invention include a phase-locked loop (PLL) integrated circuit with accelerated phase locking characteristics. Some of these PLL integrated circuits include a voltage-controlled oscillator and a loop filter having first and second input terminals and an output terminal coupled to an input of the voltage-controlled oscillator. A charge pump and a phase-lock accelerator are also provided. The charge pump is configured to drive the first input terminal of the loop filter with a pump output signal and the phase-lock accelerator is configured to drive the second input terminal of the loop filter with an analog output signal. The phase-lock accelerator is responsive to a reference clock signal and a feedback clock signal. In some of these embodiments, the loop filter may include at least one capacitor having a first electrode electrically coupled to the first input terminal of the loop filter and a second electrode electrically coupled to the second input terminal of the loop filter. The first electrode of the capacitor may also be electrically connected to the input of the voltage-controlled oscillator.

The PLL integrated circuit also includes a first phase detector, which is configured to generate a first pair of output signals (PUP, PDN) in response to the reference clock signal and the feedback clock signal. In addition, the phase-lock accelerator may include a second phase detector configured to generate a second pair of output signals (FUP, FDN) in response to the reference clock signal and the feedback clock signal and digital-to-analog converter configured to generate the analog output signal in response to the second pair of output signals. This analog output signal operates to influence a voltage of an internal node within the loop filter and thereby adjust an amount charge required to be pumped into the loop filter by the charge pump in order to achieve a locking condition within the PLL.

These embodiments of the invention may also include a frequency divider configured to generate the feedback clock signal in response to a clock signal generated at an output of the voltage-controlled oscillator. In particular, a first frequency divider may be provided that is configured to generate the reference clock signal in response to an input clock signal; and a second frequency divider may be provided that is configured to generate the feedback clock signal in response to a clock signal generated at an output of the voltage-controlled oscillator.

DETAILED DESCRIPTION OF PREFERRED EMBODIMENTS

Figure 1:
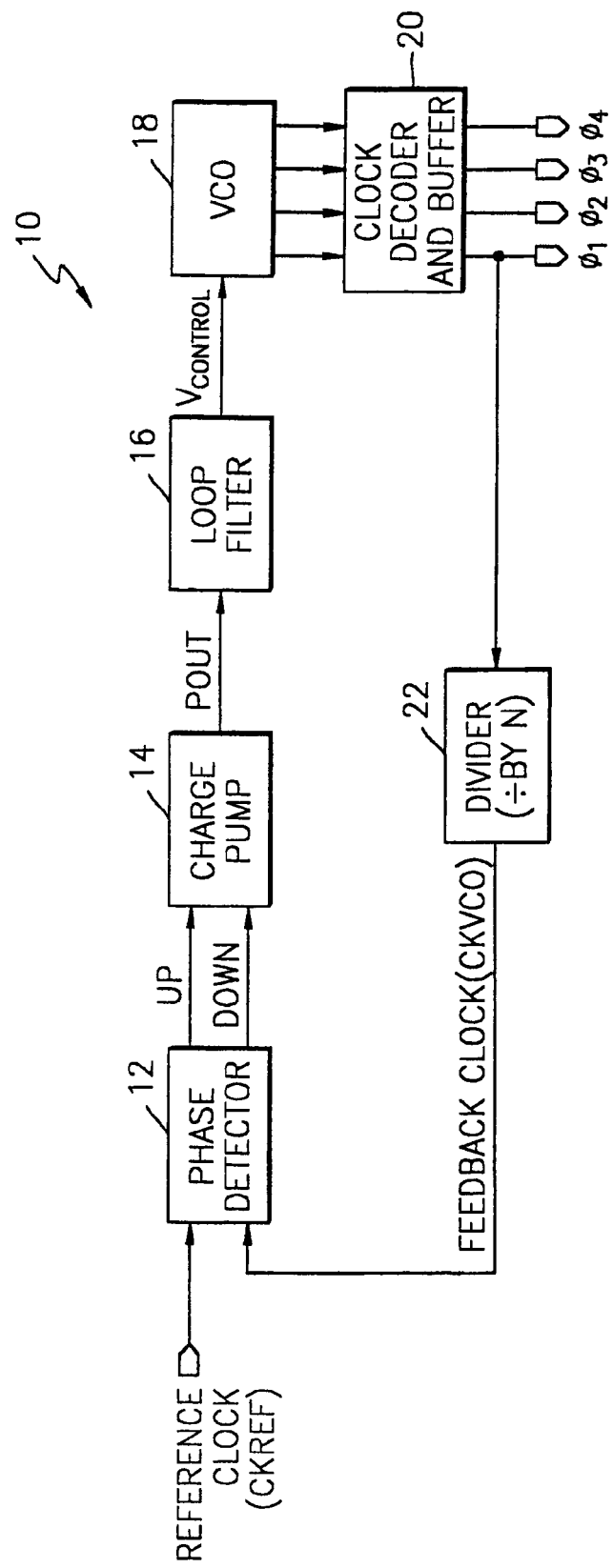
FIG. 1 is a block diagram of a first phase-locked loop integrated circuit according to the prior art.
Figure 2:
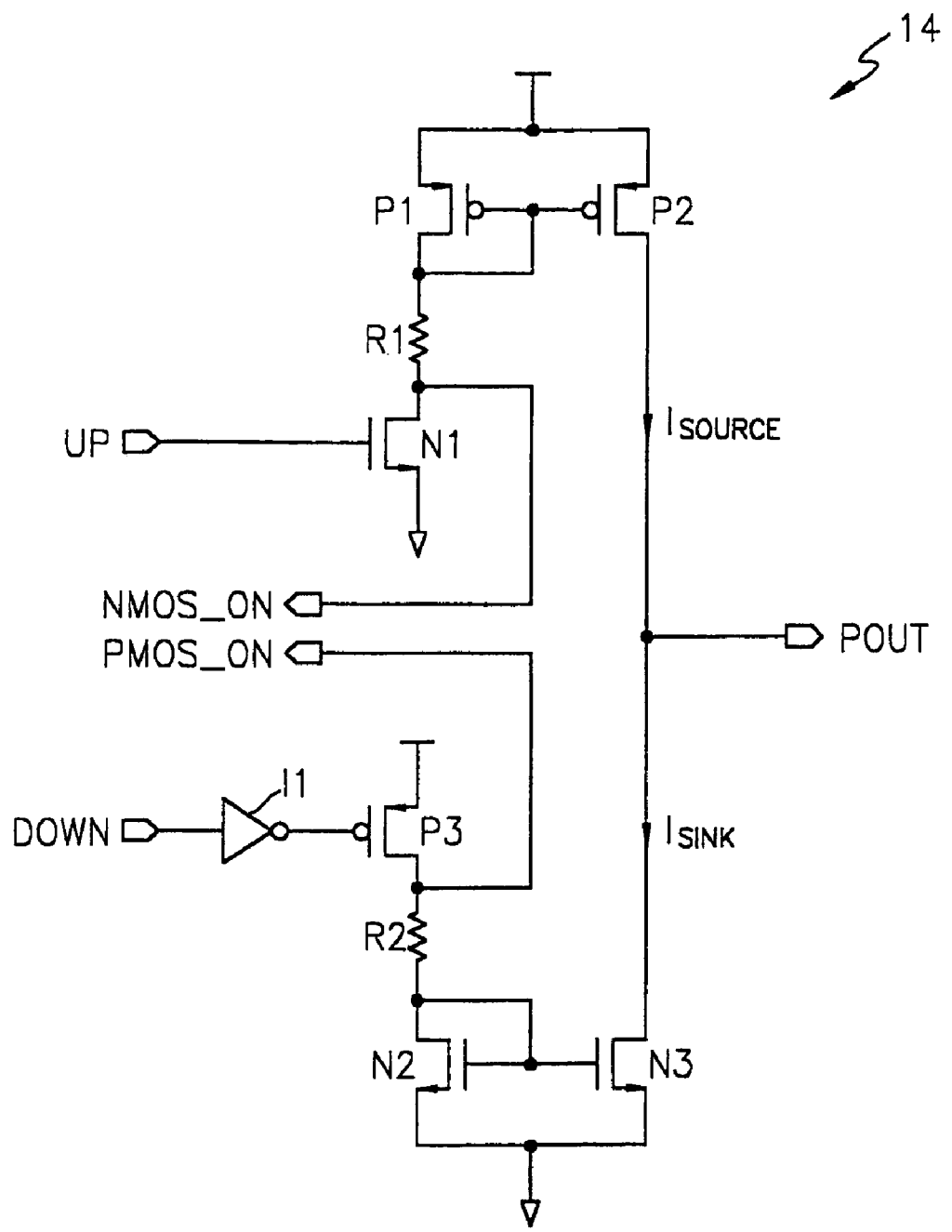
FIG. 2 is an electrical schematic of a conventional charge pump that may be used in the phase-locked loop integrated circuit of FIG. 1.
Figure 3:
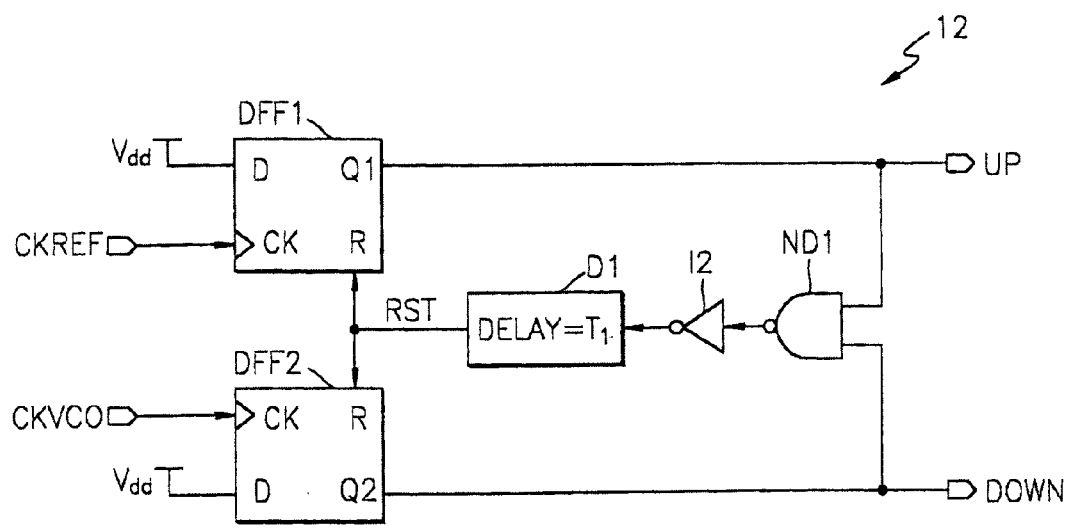
FIG. 3 is an electrical schematic of a conventional phase detector that may be used in the phase-locked loop integrated circuit of FIG. 1.
Figure 4:
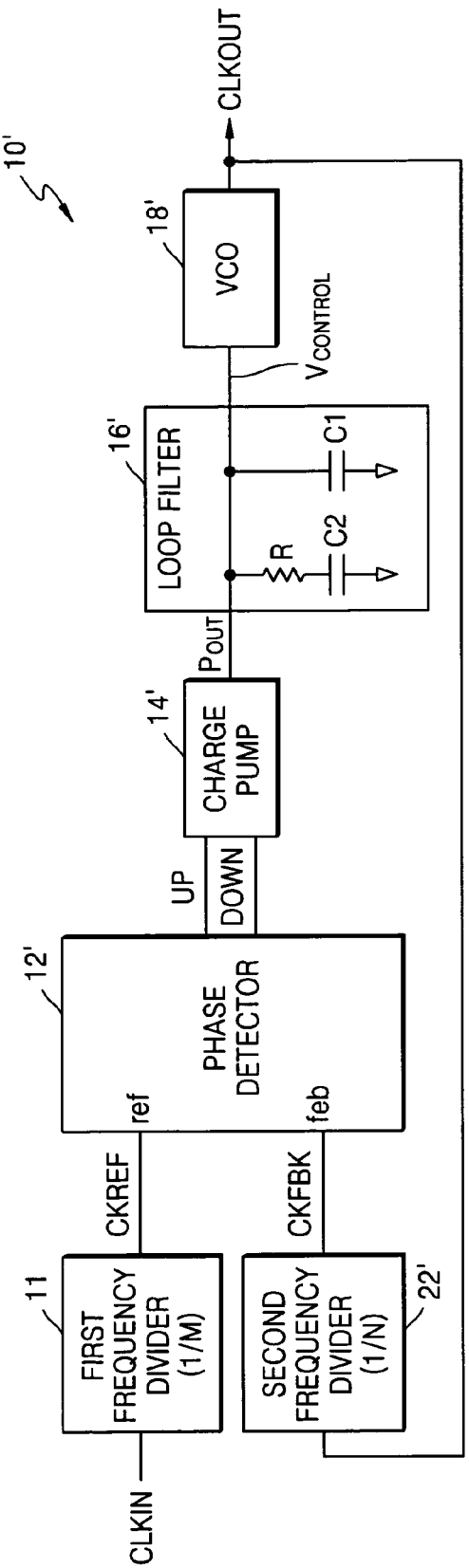
FIG. 4 is a block diagram of a second phase-locked loop integrated circuit according to the prior art.
Figure 5:
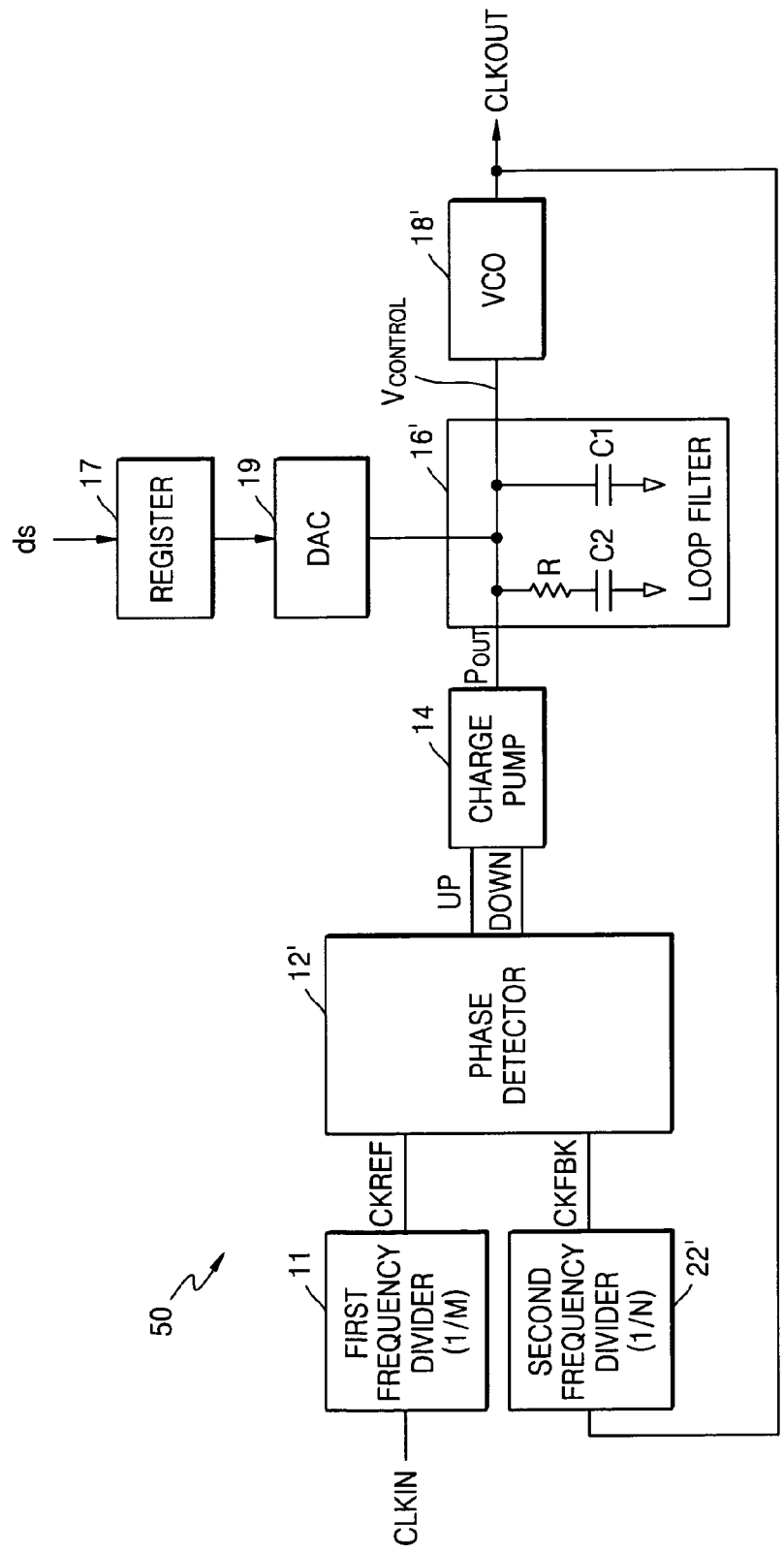
FIG. 5 is a block diagram of a third phase-locked loop integrated circuit according to the prior art.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals. The suffix B (or prefix symbol "/") to a signal name may also denote a complementary data or information signal or an active low control signal, for example.

Figure 6A:
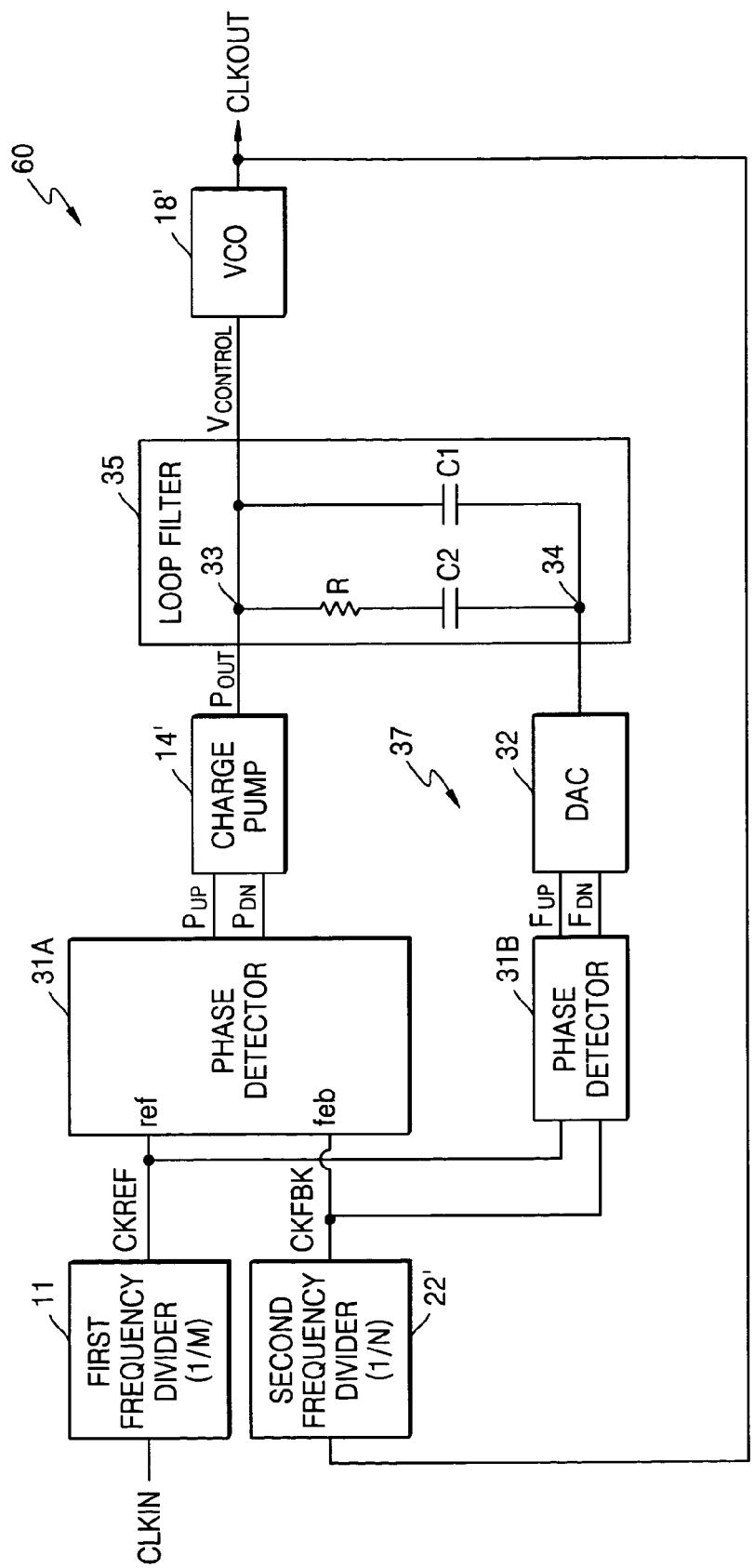
FIG. 6A is a block diagram of a phase-locked loop integrated circuit according to an embodiment of the present invention.

Referring now to FIG. 6A, a phase-locked loop (PLL) integrated circuit 60 according to an embodiment of the invention includes a voltage-controlled oscillator (VCO) 18' and a loop filter 35 having first and second input terminals and an output terminal coupled to an input of the voltage-controlled oscillator 18'. The first and second input terminals are shown as nodes 33 and 34 of the loop filter 35, which includes a resistor R and a pair of capacitors C1 and C2, connected as illustrated. A charge pump 14' is also provided, which is configured to drive the first input terminal (e.g., node 33) of the loop filter 35 with a pump output signal POUT.

The PLL integrated circuit 60 also includes a phase-lock accelerator 37, which is configured to drive the second input terminal (e.g., node 34) of the loop filter 35 with an analog output signal, in response a reference clock signal CKREF and a feedback clock signal CKFBK. The reference clock signal CKREF may be generated by a first frequency divider 11, which is a divide-by-M frequency divider responsive to an input clock signal CLKIN. The feedback clock signal CKFBK may be generated by a second frequency divider 22', which is a divide-by-N frequency divider responsive to a clock signal CLKOUT generated by the voltage-controlled oscillator 18'. The phase-lock accelerator 37 has a pair of inputs that are coupled to a pair of inputs of a first phase detector 31A. The first phase detector 31A is configured to generate a first pair of output signals PUP and PDN in response to the reference clock signal CKREF and the feedback clock signal CKFBK. The phase-lock accelerator 37 includes a second phase detector 31B and a digital-to-analog converter 32 that generates the analog output signal. Embodiments of a phase detector circuit 31 that may be used to perform the operations of the first and second phase detectors 31A and 31B of FIG. 6A are illustrated by FIGS. 7A–7B.

The loop filter 35 includes a series RC network containing a resistor R and a capacitor C2 in parallel with a capacitor C1 having a first electrode connected to the first input terminal 33 (and the input of the voltage-controlled oscillator 18') and a second electrode connected to the second input terminal 34, which receives the analog voltage generated by the digital-to-analog converter 32.

Figure 6B:
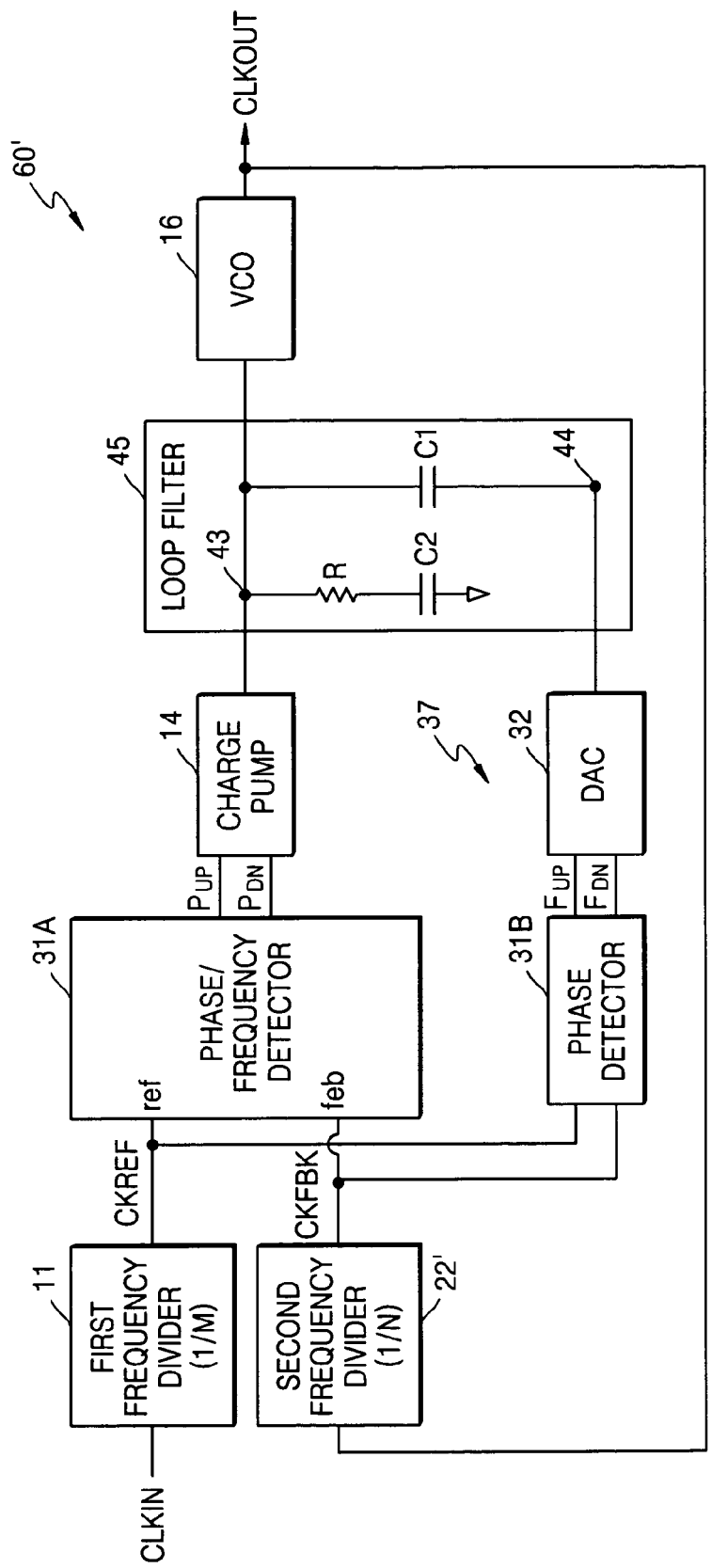
FIG. 6B is a block diagram of a phase-locked loop integrated circuit according to an embodiment of the present invention.
Figure 6C:
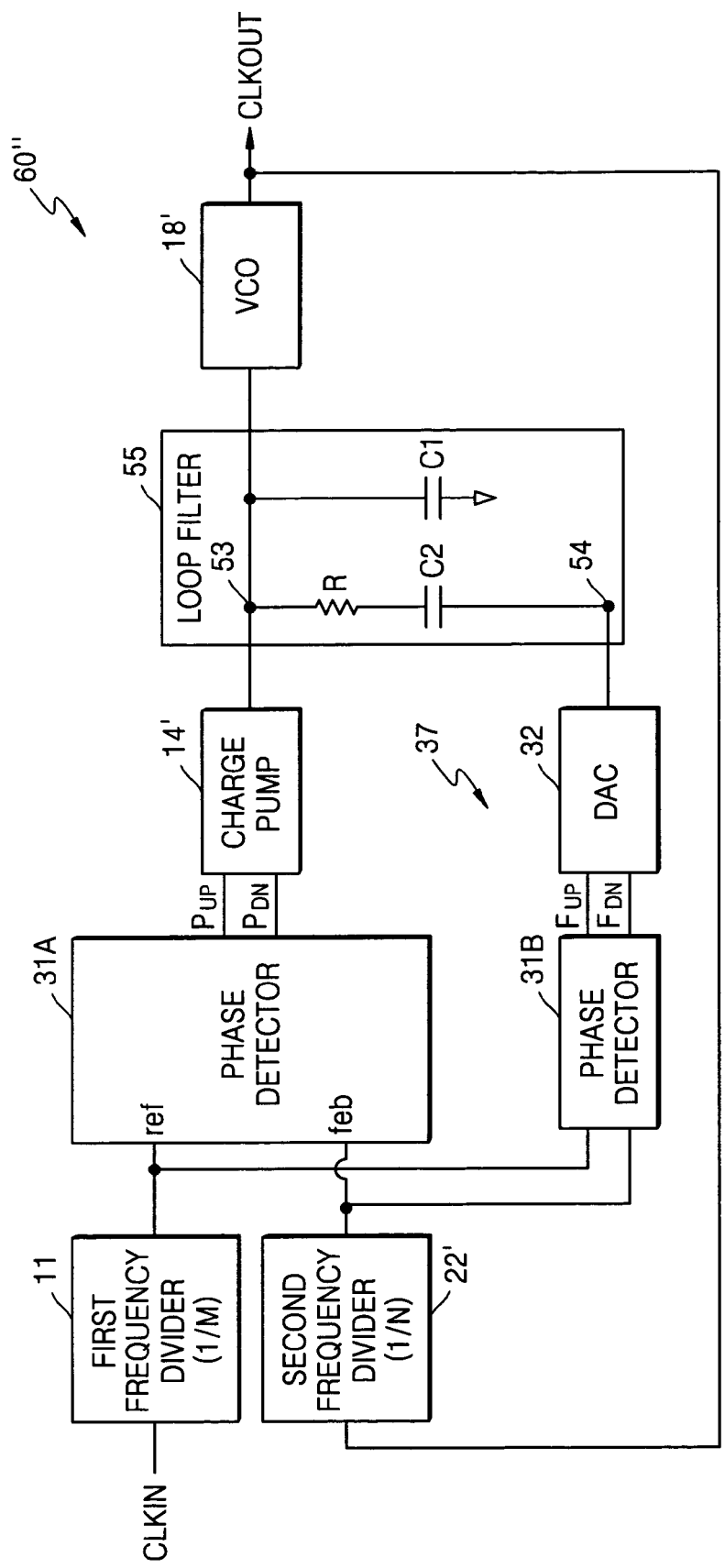
FIG. 6C is a block diagram of phase-locked loop integrated circuit according to an embodiment of the present invention.

The PLL integrated circuits 60' and 60" of FIGS. 6B and 6C are similar to the PLL integrated circuit of FIG. 6A, however, the loop filters 45 and 55 in FIGS. 6B and 6C are different than the loop filter 35 in FIG. 6A. In particular, the RC network containing resistor R and capacitor C2 in the loop filter 45 of FIG. 6B is not directly connected to the second input terminal (i.e., node 44) or the output of the digital-to-analog converter 32. However, the capacitor C1 includes a first electrode connected to the first input terminal (i.e., node 53) and a second electrode connected to the second input terminal (i.e., node 44). In contrast, in the loop filter 55 of FIG. 6C, an electrode of the capacitor C2 in the RC network containing resistor R and capacitor C2 is directly connected to the second input terminal (i.e., node 54) and the output of the digital-to-analog converter 32. In addition, the first electrode of the capacitor C1 is connected to the first input terminal 53 and a terminal of the resistor R within the RC network.

Figure 7A:
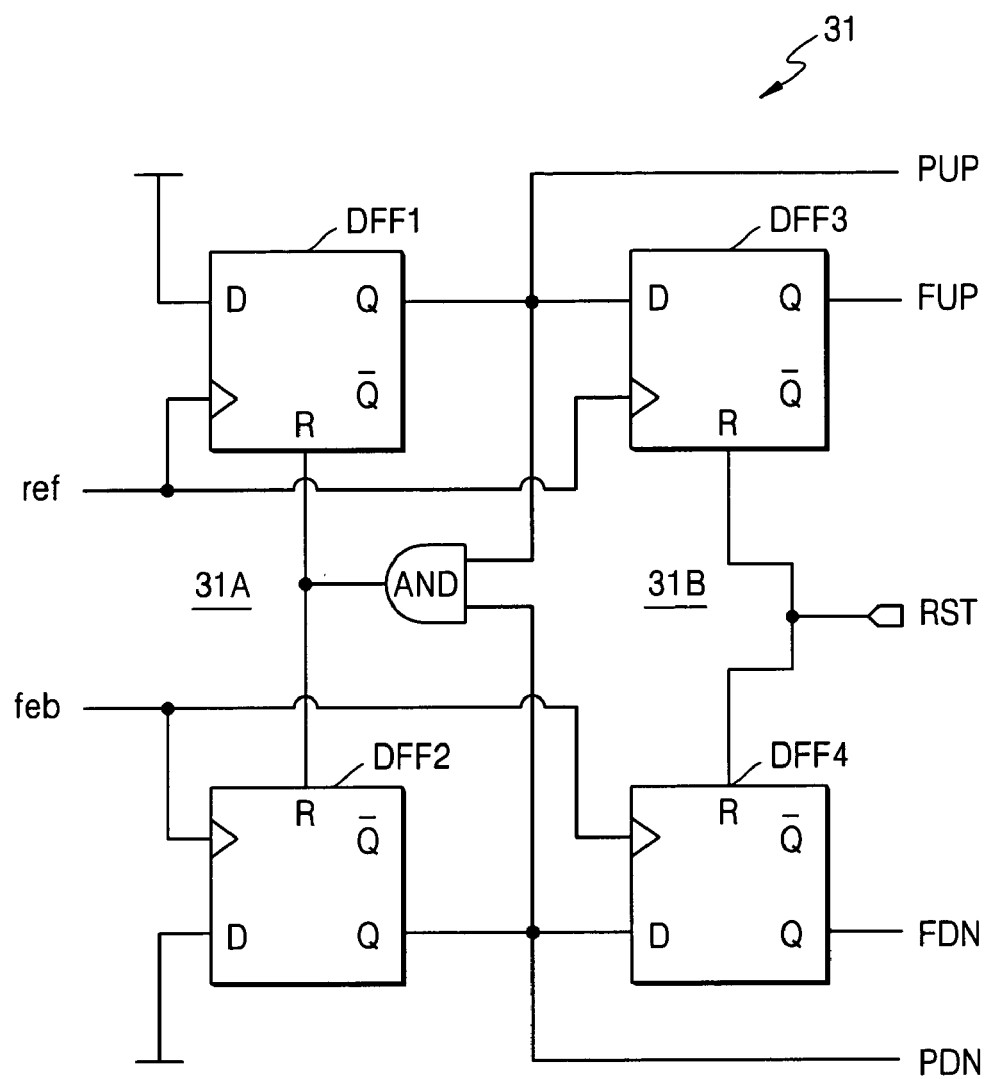
FIG. 7A is an electrical schematic of a phase detector circuit that may be used in the phase-locked loop integrated circuits of FIGS. 6A–6C.
Figure 7B:
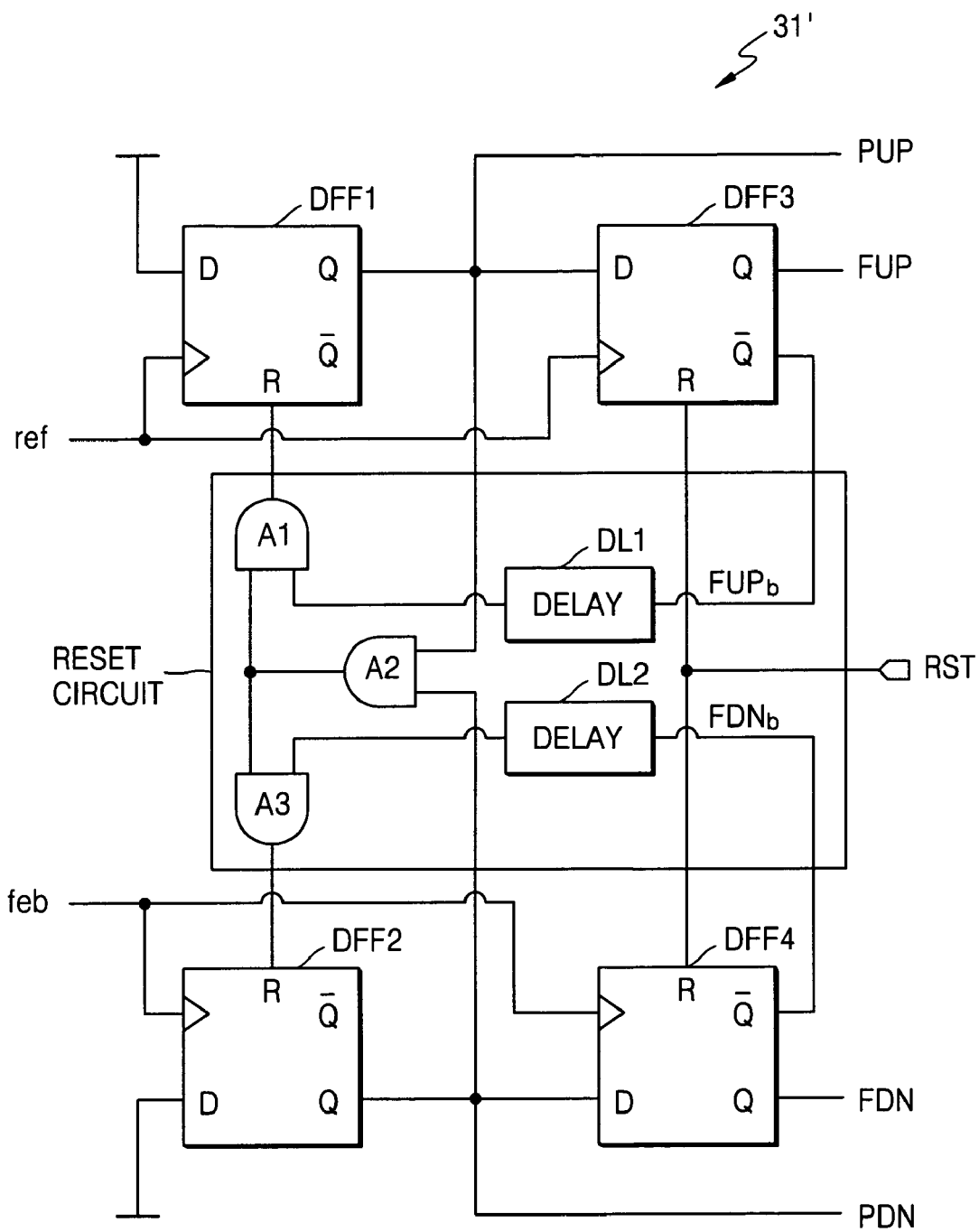
FIG. 7B is an electrical schematic of a phase detector circuit that may be used in the phase-locked loop integrated circuits of FIGS. 6A–6C.

Two embodiments of a phase detector circuit are illustrated by FIGS. 7A–7B. In FIG. 7A, a phase detector circuit 31 is illustrated as including a first phase detector 31A and a second phase detector 31B. The first phase detector 31A is illustrated as including first and second D-type flip-flops (DFF1, DFF2) and an AND logic gate which operates to reset these flip-flops when the true outputs Q of these flip-flops are both set to logic 1 levels (i.e., PUP=PDN=1). These true outputs Q of the first and second flip-flops are connected to the output terminals PUP and PDN of the first phase detector 31A. The second phase detector 31B is illustrated as including third and fourth D-type flip-flops (DFF3, DFF4), which are responsive to the true outputs of the first phase detector 31A. The third and fourth D-type flip-flops DDF3 and DFF4 are also responsive to a reset signal RST. As will be understood by those skilled in the art, the true output Q of the third D-type flip-flop DDF3 (i.e., signal FUP) will be set to a logic 1 level when the true output Q of the first D-type flip-flop is high at a logic 1 level and a leading edge of the reference clock signal CKREF is received. Similarly, the true output Q of the fourth D-type flip-flop DDF4 (i.e., signal FDN) will be set to a logic 1 level when the true output Q of the second D-type flip-flop is high at a logic 1 level and a leading edge of the feedback clock signal CKFBK is received. Once these third and fourth flip-flops have both been set (i.e., FUP=FDN=1), the value of the analog output voltage generated by the digital-to-analog converter 32 will cease to vary until such time as these flip-flips are reset and a new phase locking adjustment is performed.

The phase detector circuit 31' of FIG. 7B is illustrated as including first and second D-type flip-flops (DFF1, DFF2) and a reset circuit, which is responsive to the true outputs Q of the first and second flip-flops DFF1 and DFF2 and also responsive to the complementary outputs /Q of the third and fourth flip-flips DFF3 and DFF4. These complementary outputs /Q develop the signals FUPb and FDNb, which are provided as inputs to respective delay elements DL1 and DL2 within the reset circuit. The reset circuit also includes three AND gates (A1, A2 and A3), connected as illustrated. The true outputs Q of the first and second flip-flops DFF1 and DFF2 are connected to the output terminals PUP and PDN of the first phase detector 31A. The second phase detector within the phase detector circuit 31' is illustrated as including third and fourth D-type flip-flops (DFF3, DFF4), which are responsive to the true outputs of the first phase detector and a reset signal RST.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A phase-locked loop (PLL) integrated circuit, comprising:
   a voltage-controlled oscillator;
   a loop filter having first and second input terminals and an output terminal coupled to an input of said voltage-controlled oscillator;
   a charge pump configured to drive the first input terminal of said loop filter with a pump output signal;
   a first phase detector configured to generate a first pair of output signals in response to the reference clock signal and the feedback clock signal; and
   a phase-lock accelerator configured to drive the second input terminal of said loop filter with an analog output signal, in response to a reference clock signal and a feedback clock signal, said phase-lock accelerator comprising:
   a second phase detector configured to generate a second pair of output signals in response to the reference clock signal and the feedback clock signal; and a digital-to-analog converter configured to generate the analog output signal in response to the second pair of output signals.

2. The PLL integrated circuit of claim 1, wherein said loop filter comprises a capacitor having a first electrode electrically coupled to the first input terminal of said loop filter and a second electrode electrically coupled to the second input terminal of said loop filter.

3. The PLL integrated circuit of claim 1, further comprising a frequency divider configured to generate the feedback clock signal in response to a clock signal generated at an output of said voltage-controlled oscillator.

4. The PLL integrated circuit of claim 1, further comprising:
   a first frequency divider configured to generate the reference clock signal in response to an input clock signal; and
   a second frequency divider configured to generate the feedback clock signal in response to a clock signal generated at an output of said voltage-controlled oscillator.

5. The PLL integrated circuit of claim 1, wherein said first phase detector comprises:
   a first D-type flip-flop having a data input responsive to a power supply voltage and a clock input responsive to the reference clock signal; and
   a second D-type flip-flop having a data input responsive to the power supply voltage and a clock input responsive to the feedback clock signal.

6. The PLL integrated circuit of claim 5, wherein said second phase detector comprises:
   a third D-type flip-flop having a data input coupled to a true output of said first D-type flip-flop and a clock input responsive to the reference clock signal; and
   a fourth D-type flip-flop having a data input coupled to a true output of said second D-type flip-flop and a clock input responsive to the feedback clock signal.

7. The PLL integrated circuit of claim 6, wherein the first pair of output signals are derived from the true outputs of said first and second D-type flip-flops; and wherein the second pair of output signals are derived from the true outputs of said third and fourth D-type flip-flops.

8. The PLL integrated circuit of claim 7, wherein said first phase detector further comprises an AND gate having a first input coupled to the true output of said first D-type flip-flop, a second input coupled to the true output of said second D-type flip-flip and an output coupled to reset inputs of said first and second D-type flip-flops.

9. The PLL integrated circuit of claim 8, wherein said first phase detector further comprises a reset circuit configured to drive the reset inputs of said first and second D-type flip-flops with reset signals in response to signals generated at the true outputs of said first and second D-type flip-flops and signals generated at the complementary outputs of said third and fourth D-type flip-flops.

10. A phase-locked loop (PLL) integrated circuit, comprising:
   a first phase detector configured to generate a first pair of output signals in response to a reference clock signal and a feedback clock signal;
   a second phase detector configured to generate a second pair of output signals in response to the reference clock signal and the feedback clock signal;
   a charge pump configured to generate a pump output signal in response to the first pair of output signals;
   a digital-to-analog converter configured to generate an analog output signal in response to the second pair of output signals;
   a loop filter configured to generate a control signal in response to the pump output signal and the analog output signal; and
   a voltage-controlled oscillator responsive to the control signal.

11. A phase-locked loop (PLL) integrated circuit, comprising:
   a voltage-controlled oscillator;
   a loop filter having first and second input terminals and an output terminal coupled to an input of said voltage-controlled oscillator;
   a charge pump configured to drive the first input terminal of said loop filter with a pump output signal; and
   a phase-lock accelerator configured to drive the second input terminal of said loop filter with an analog output signal that adjusts a voltage on a node in said loop filter when the PLL integrated circuit is seeking a phase lock condition, said phase-lock accelerator comprising a phase detector configured to generate at least one output signal in response to a reference clock signal and a feedback clock signal and a digital-to-analog converter configured to generate the analog output signal in response to the at least one output signal.

* * * * *